(12) United States Patent
Ashourloo et al.

(10) Patent No.: US 11,165,426 B1
(45) Date of Patent: Nov. 2, 2021

(54) LEVEL SHIFTER AND A METHOD OF LEVEL SHIFTING A SIGNAL

(71) Applicant: NXP USA, Inc., Austin, TX (US)

(72) Inventors: Mojtaba Ashourloo, Toronto (CA); John Pigott, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/008,977

(22) Filed: Sep. 1, 2020

(51) Int. Cl.
| | |
|---|---|
| H03K 19/0185 | (2006.01) |
| H03K 19/20 | (2006.01) |
| H03K 3/356 | (2006.01) |

(52) U.S. Cl.
CPC . H03K 19/018528 (2013.01); H03K 3/35613 (2013.01); H03K 19/20 (2013.01)

(58) Field of Classification Search
CPC ... H03K 19/018528; H03K 19/018521; H03K 19/017509; H03K 19/018507; H03K 19/20; H03K 17/16; H03K 17/6874; H03K 3/2885; H03K 5/02
USPC .......................................................... 327/333
See application file for complete search history.

(56) References Cited

U.S. PATENT DOCUMENTS

| | | | | |
|---|---|---|---|---|
| 4,980,583 A * | 12/1990 | Dietz | ............... | H03K 3/356104 326/17 |
| 5,637,971 A | 6/1997 | Pratt | | |
| 5,781,026 A * | 7/1998 | Chow | ............... | H03K 3/356147 326/26 |
| 6,445,210 B2 * | 9/2002 | Nojiri | ............... | H03K 3/356113 326/68 |
| 10,771,045 B1 * | 9/2020 | Chen | ................ | H03K 3/356104 |
| 2009/0273370 A1 | 11/2009 | Shinde | | |

OTHER PUBLICATIONS

Liu, Dawei et al.; "A New Design Technique for Sub-Nanosecond Delay and 200 V/ns Power Supply Slew-Tolerant Floating Voltage Level Shifters for GaN SMPS"; IEEE Transaction on Circuits and Systems—I: Regular Papers, 66(3); University of Bristol—Open Access; 12 pages (2019).
Maderbacher, Gerhard et al.; "Fast and Robust Level Shifters in 65nm CMOS"; Proceedings fo the ESSCIRC, Sep. 12-16, 2011, Helsinki, Finland; IEEE Explore; pages (Oct. 13, 2011).
Moghe, Yashodham et al.; "Nanosecond Delay Floating High Voltage Level Shifters in a 0.35μ HV-CMOS Technology"; IEEE J. of Solid-State Circuits, vol. 46, No. 2; 13 pages (Feb. 2011).
Wittmann, Juergen et al; "A 50V High-Speed Level Shifter with High dv/dt Immunity for Multi-MHz DCDC Converters"; 40th European Solid State Circuits Conference, Sep. 22-26, 2014, Venice Lido, Italy; IEEE Xplore; 4 pages (Nov. 3, 2014).
Yunwu, Zhang et al; "A Noise Immunity Improved level Shift Structure for a 600 V HVIC"; Journal of Semiconductors, vol. 34, No. 6; 5 pages (Jun. 2013).

* cited by examiner

Primary Examiner — Hai L Nguyen

(57) ABSTRACT

A level shifter comprising: a translation circuit having two input lines and two output lines and configured to receive a differential signal in a low-voltage domain on the two input lines and provide a second differential signal, being a copy of the first differential signal, in a high-voltage domain on the two output lines; and a combiner circuit configured to convert the second differential signal into a single-ended signal at a high-voltage shifter output; wherein the combiner circuit comprises a two-input Muller C-element circuit wherein one input is inverted. Corresponding methods are also disclosed.

21 Claims, 7 Drawing Sheets

Figure 3A (Prior Art)

| X1 | X2 | Y(n) |
|----|----|------|
| 0  | 1  | 0    |
| 1  | 1  | 1    |
| 0  | 1  | 1    |

Figure 3B

| X1 | X2 | Y(n) |
|----|----|------|
| 1  | 0  | 1    |
| 1  | 1  | 1    |
| 1  | 0  | 1    |
| 0  | 0  | 1    |
| 0  | 1  | 0    |

Figure 3C

| X1 | X2 | Y(n) |
|----|----|------|
| 0  | 1  | 0    |
| 1  | 1  | 0    |
| 0  | 1  | 0    |
| 0  | 0  | 0    |
| 1  | 0  | 1    |

Figure 3D

| X1 | X2 | Y(n)   |
|----|----|--------|
| 0  | 0  | 0      |
| 0  | 1  | Y(n-1) |
| 1  | 0  | Y(n-1) |
| 1  | 1  | 1      |

Figure 3E

| X1 | X2 | Y(n)   |
|----|----|--------|
| 0  | 1  | 0      |
| 0  | 0  | Y(n-1) |
| 1  | 1  | Y(n-1) |
| 1  | 0  | 1      |

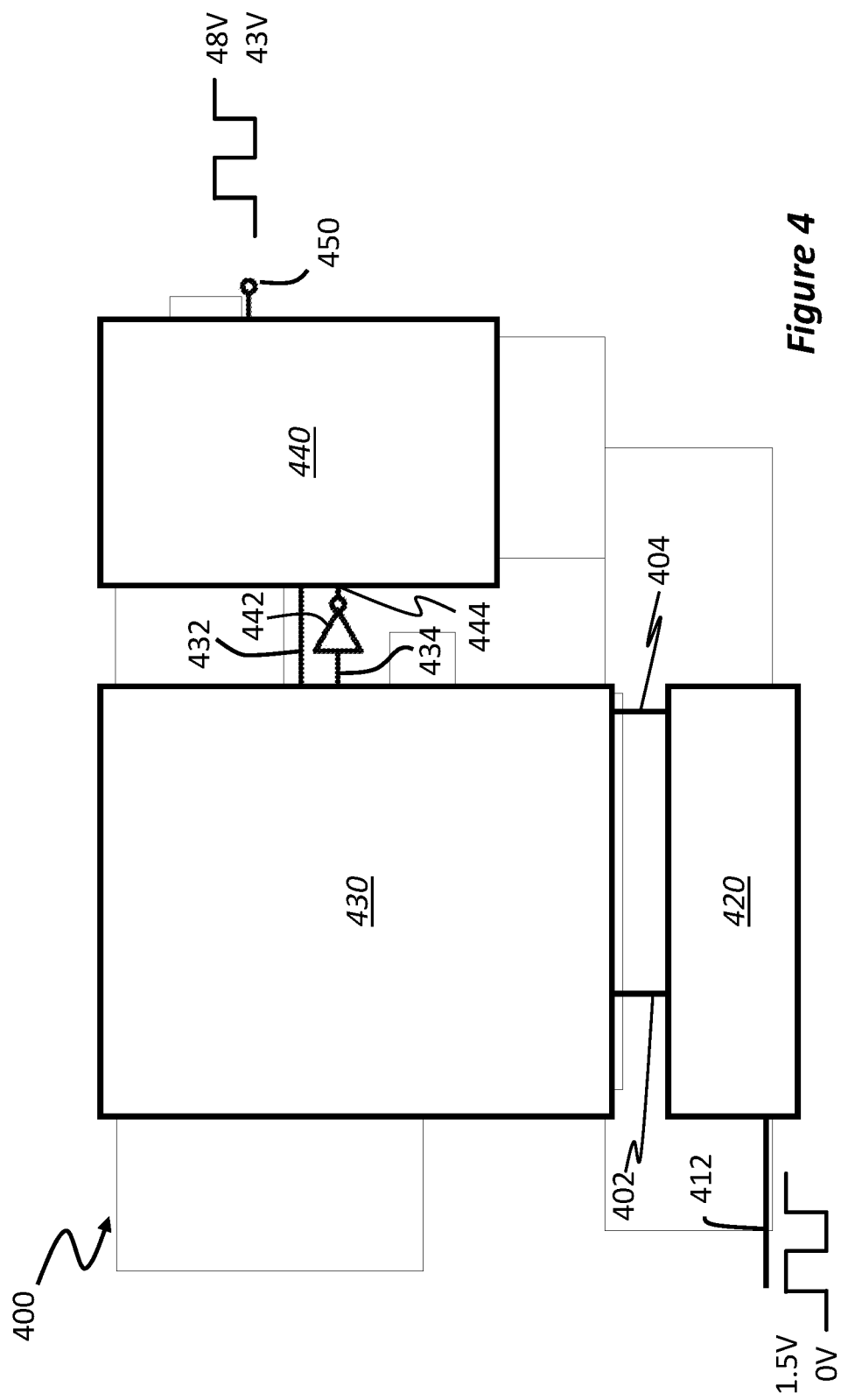

LEVEL SHIFTER AND A METHOD OF LEVEL SHIFTING A SIGNAL

FIELD

The present disclosure relates to level shifters, and in particular to level shifters which use a differential signal to shift a binary signal from a low-voltage domain to a high-voltage domain, and combine the differential signal to provide a single-ended output.

BACKGROUND

Level shifters are a class of circuit which translate, or shift, a signal, which may be a voltage signal or a current signal, from one voltage domain to another voltage domain. Although level shifters may be able to shift the voltage domain of a multilevel, or even analogue, signal, and may be able to shift the signal from a relatively high-voltage domain to a relative low-voltage domain, the present disclosure is concerned with level shifters which shift or translate a binary signal from a low-voltage domain to a high-voltage domain.

Two figures of merit associated with such level shifters are propagation delay and slew rate. Propagation delay refers to the time interval between the commencement of a transition (e.g. from low to high) in the low-voltage domain and the same transition commencing in the high-voltage domain: it is generally desirable to minimise the propagation delay. The slew rate refers to the time that it takes for a signal (in either the low-voltage domain or the high-voltage domain) to transition from one state to the other state (e.g. from low to high): it is desirable to have a fast slew rate.

As will be discussed in more detail hereinbelow, a known, convenient way to achieve a low propagation delay and a high slew rate is by converting the signal in the low-voltage domain into a differential signal, and level shifting the differential signal before converting it back to a single ended signal.

However, the use of a differential signal introduces the possibility of "glitches". In particular, the single-ended signal may, in some circumstances, undesirably transition from one state to the other when one side of the differential signal has transitioned (e.g. from low to high) but the other side of the signal has not completed the complementary transition (that is, in this case, from high to low). It would be useful to be able to reduce, minimise or even eliminate such glitches.

SUMMARY

According to a first aspect of the present disclosure there is provided a translation circuit having two input lines and two output lines and configured to receive a differential signal in a low-voltage domain on the two input lines or wires and provide a second differential signal, being a copy of the first differential signal, in a high-voltage domain on the two output lines; and a combiner circuit configured to convert the second differential signal into a single-ended signal at a high-voltage shifter output (450); wherein the combiner circuit comprises a two-input Muller C-element circuit wherein one input is inverted. Use of a Muller C-element circuit with one inverted inputs may ameliorate or even eliminate problems that may otherwise occur due to glitches in the shifter, and in particular due to glitches arising from fast common-mode slew rate in the high-voltage domain, or failure of complementarity in the differential signals at the output of the level shifter. Thus the level shifter shifts a signal from a low-voltage domain to a high-voltage domain, wherein the high-voltage domain is at a higher voltage than the low-voltage domain.

In one or more embodiments, the two-input Muller C-element circuit wherein one input is inverted is implemented using NAND gates and inverters. NAND gates and inverters are particularly simple logic elements and a combination thereof may provide a compact and relatively inexpensive solution. In addition, it may only require lower power than alternative implementations.

In one or more embodiments the output of the modified Muller C-element circuit is configured to change state only after both elements of the second differential signal have inverted. In other words, since the differential signal includes a main signal and its complement, the circuit is configured to change state only after the main signal and its complementary signal have both transitioned or changed state. As used herein, the term "element" refers to one half of a differential signal, thus where a differential signal is said to be "on two lines", or "on two wires" one element of the signal is on one line (or wire) and the other element, being the complement of the first element is on the other line (or wire).

In one or more embodiments the modified Muller C-element circuit comprises two stages, each stage comprising a pair of NAND gates, the NAND gates of the second stage being cross-coupled such that the output from each NAND gate is connected to a respective first input of the other NAND gate, the output from a one of the pair of second stage NAND gates being connected to the high-voltage shifter output. In one or more embodiments the respective second input of each NAND gates of the second stage is connected to an output of a respective NAND gate of the first stage, wherein each NAND gate of the first stage has a first input connected to a respective one of the further two lines and a second input connected via a respective inverter to the respective other of the further two lines.

In one or more other embodiments, the two-input Muller C-element circuit is implemented using NOR gates or NOR gates and inverters. Alternative implementations are also possible using more complex gates. However, simple logic circuitry using NOR gates, and even more so using NAND gates, is straightforward to design and is particularly efficient in terms of "real-estate"—that is the area of semiconductor required for any specific layout.

In one or more embodiments the translation circuit comprises a pair of cross-coupled FETs operable in the high-voltage domain, each having a source connected to a high-voltage supply line, each having a drain connected to a respective one of the two output lines, and each having a gate connected to a respective other of the two further lines. The translation circuit may further comprise a further pair of FETs, each having a source connected to a ground, each having a gate coupled to respective ones of the two input lines, and each having a drain connected to a respective drain of a respective one of a yet further pair of FETs, the yet further pair of FETs each having a source connected to a respective one of the two output lines, and each having a gate connected to the gate of the other one of the further pair of FETs. Of course, the skilled person will be aware, that in such embodiments one or more of the FETs may be implemented with other transistors, such as bipolar transistors and resistor and/or capacitors.

In one or more embodiments the further pair of FETs and the yet further pair of FETs are each operable across the low-voltage domain and the high-voltage domain. Thus the further pair of FETs and the yet further pair of FETs generally should be high-voltage transistors, able to withstand the voltage across both low and high-voltage domain—typically this may be 48V or 120V or even 240V; conversely the pair of cross coupled FETs are operable only within the high-voltage domain, and thus smaller low-voltage transistors which may only need to withstand for instance 5 V, are suitable for use in those positions.

In one or more embodiments, the level shifter further comprises a low-voltage circuit configured to convert a single-ended signal at a low-voltage shifter input into the first differential signal. The low-voltage circuit may comprise a buffer connecting the low-voltage shifter input to the gate of a one of the pair of FETs, and an inverter connecting the gate of the other of the further pair of FETs is to the low-voltage shifter input. The low-voltage circuit generally operates in the low-voltage domain.

According to a second aspect of the present disclosure there is provided a method of level shifting a signal from a low-voltage domain to a high-voltage domain, the method comprising: providing the signal in the low-voltage domain as a differential signal; translating the differential signal from the low-voltage domain to the higher-voltage domain, and converting the differential signal in the high-voltage domain into a single-ended signal by a modified Muller C-element; wherein the modified Muller C-element is Muller C-element having one input inverted.

The input signal may be a single-ended binary, and providing the signal in the low-voltage domain as a differential signal may comprise converting the single-ended binary signal into the differential signal in the low-voltage domain.

In one or more embodiments, the modified Muller C-element circuit comprises two stages, each stage comprising a pair of NAND gates, the NAND (546,548) gates of the second stage being cross-coupled such that the output from each NAND gate is configured to provide a respective first input of the other NAND gate, the output from a one of the pair of second stage NAND gates being connected to the high-voltage shifter output.

In one or more embodiments, an output of each NAND gate of the first stage is configured to provide a, respective second input of each respective NAND gate of the second stage, and wherein each NAND gate of the first stage is configured to be provided with a first input from a respective one of the further two lines and a second input, via a respective inverter, from the respective other of the further two lines.

According to a third aspect, there is provided, a level shifter comprising a first part configured to translate a differential signal from a low-voltage domain signal to a high-voltage domain signal, and a second part, configured to provide a level shifted output from the high-voltage domain signal, wherein the second part comprises a two-input Muller C-element circuit wherein one input is inverted.

In at least one embodiment, the output of the modified Muller C-element circuit is configured to change state only after both elements of the high-voltage domain signal are simultaneously inverted.

In at least one embodiment the two-input Muller C-element circuit wherein one input is inverted, is implemented using NAND gates and invertors.

In at least one embodiment, the modified Muller C-element circuit comprises two stages, each stage comprising a pair of NAND gates, the NAND gates of the second stage being cross-coupled such that the output from each NAND gate is connected to a respective first input of the other NAND gate, the output from a one of the pair of second stage NAND gates being connected to the shifter output.

In at least one embodiment, the level shifter further comprises a low-voltage circuit configured to convert a single-ended signal at a low-voltage shifter input into the differential signal in the low-voltage domain These and other aspects of the invention will be apparent from, and elucidated with reference to, the embodiments described hereinafter.

BRIEF DESCRIPTION OF DRAWINGS

Embodiments will be described, by way of example only, with reference to the drawings, in which

FIGS. 3A, 3B, 3C, 3D and 3E show various truth tables associated with the present disclosure;

FIG. 4 shows a block diagram of a level shifter according to one or more embodiments;

Figure 1:
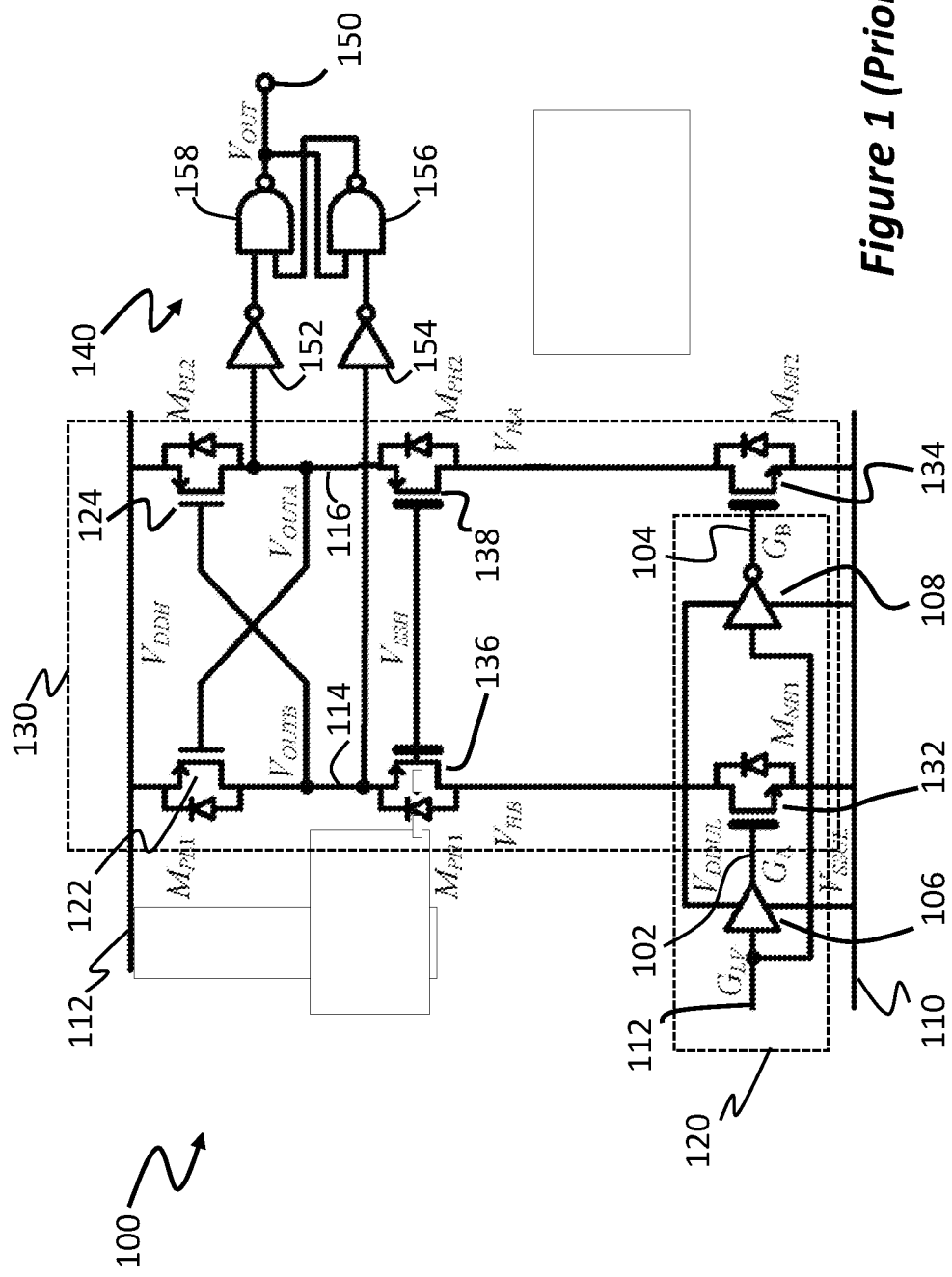
FIG. 1 illustrates a known low-voltage domain to high-voltage domain level shifter.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments.

DETAILED DESCRIPTION OF EMBODIMENTS

FIG. 1 illustrates a known low-voltage domain to high-voltage domain level shifter 100. The level shifter comprises a low-voltage circuit 120 configured to convert a signal at a low-voltage shifter input into a first differential signal on two lines or wires 102, 104 having two relatively low-voltage levels.

The level shifter further comprises a translation circuit 130. The translation circuit has two input lines 102, 104 and two output lines 114, 116 and is configured to receive a differential signal in a low-voltage domain on the two input lines and provide a second differential signal, being a copy of the first differential signal, in a high-voltage domain on the two output lines. The skilled person will appreciate that as used herein, a "copy" of a signal is one which has the status high when the original signal has a status high and a status low when the original signal has a status low. As ready mentioned, propagation delays may result in the copy being delayed in time with respect to the original, Moreover, the slew rate of the copy, as it changes state (e.g. from "low" to "high", may be different to the slew rate of the original.

The translation circuit comprises a pair of cross-coupled FETs MPL1 122, MPL2 124 operable in the high-voltage domain, as will discussed in more detail hereinbelow.

The translation circuit comprises a further pair of FETs MNH1 132 and MNH2 134, each having a source connected to a ground, and each having a gate coupled to a one of the shifter input and an inverted copy of the shifter input respectively. The first line, and thus the gate of a one MNH1 of the pair of FETs, may be coupled to the shifter input directly or by a buffer 106. The second line, and thus the gate of the other MNH2 of the pair of FETs, is coupled to the shifter input by an inverter 108.

The translation circuit further comprises the yet further pair of FETs MPH1 136 and MPH2 138, each having a drain connected to a respective drain of one of the further pair of FETs 136 138. The yet further pair of FETs each have a source connected to a respective of the two output lines 114 and 116. The gates of the yet further pair of FETs are connected to each. The gates of these two FETS are tied together, and they operate in a cascode configuration to protect the upper FETs MPL1 and MPL2: that is to say, they prevent the lower FETs MNH1 and MNH2 from pulling the gates of MPL1 and MPL2 lower than VSSH. Typically, as discussed below, VSSH is biased between 4.5 and 5.5 V, or approximately 5 volts, below VDDH.

The pair of cross-coupled FETs MPL1 132, MPL2 134 of the translation circuit each have a source connected to a high-voltage supply line VDDH 112. They each have a drain connected to a respective one of the two output lines, and each has a gate connected to the other of the two output lines.

In operation when the level-shifted signal is in a first state, one of the pair of cross-coupled FETs MPL1 132 and MPL2 134 is closed that is to say conducting or "on" and the other one is open, that is to say non-conducting or "off". For definiteness it will be assumed that this corresponds to MPL1 122 being off and MPL2 2124 being on; conversely, in the second state MPL1 is on and MPL2 is off. (The skilled person will recognise that it could equally be that in the first state MPL1 is off and MPL2 2124 is on, and in the second state MPL1 is on and MPL2 off.) Since, in the first state, MPL2 is on, the voltage at the second output line 116, being connected to the drain of MPL2, is the same as the high-voltage supply voltage VDDH (ignoring the voltage drop R_DSON across MPL2 in its on-state, which is generally sufficiently small as to be negligible). The second signal line 116 is connected to the gate of the first cross-coupled FET MPL1. Both source and gates of MPL1 are thus at the high-voltage supply voltage VDDH, so MPL1 is off, or open. At the same time, it will be appreciated that for MPL2 to be on, the gate source voltage generally exceeds the threshold voltage VTH of the FET, and since the first output line 114 is connected to the gate of this second cross-coupled FET MPL2, the voltage of the first upper line 114 is approximately (VSSH+|VTH|). In a typical circuit, VDDH-VSSH may be approximately 5 V, and |VTH| may be approximately 1 V, thus the voltage on line 114 may be approximately 4 V lower than VDDH. (The skilled person will be aware that for a p-channel device, VTH is a negative value, so using the absolute value |x|, with explicit sign-handling improves clarity.)

Thus, in the high-voltage domain, a "high" signal exists on the second output line 116 at a voltage VDDH, and a "low" signal exists on the first voltage output line 114 at a voltage (VSSH+VTH).

Conversely, when the level shifted signal is in the second state, a "low" signal exists on the second output line 116 at a voltage (VSSH+VTH), and a "high" signal exists on the first voltage output line 114 at a voltage VDDH.

The level shifter implements a change of state by following the input, after a delay, and possibly with glitches.

The level shift of FIG. 1 further comprises a combiner circuit 140 configured to convert the second differential signal into a single-ended signal at a high-voltage shifter output 150. The combiner circuit comprises a pair of inverters 152, 154, each connected to a different one of the further lines 114 and 116, and a pair of NAND gates 156 and 158. The NAND gates 156 and 158 are cross-coupled, each having its output connected to one of the two inputs of the other NAND gate, and its second input connected to the output of a respective one of the inverter is 152 and 154. The output of one of the NAND gates is also connected as the output VOUT 150. The combiner circuit operates as a conventional RS (set-reset) latch which provides a quasi-stable signal. The circuit is described as being "quasi-stable" rather than "stable", since fast common-mode slew rates, and other factors or interferers, may interrupt its operation as will be discussed in more detail hereinbelow.

The above level shifter has good (that is to say low) propagation delay and can enable a high slew rate. However it is prone to glitches as defined above, that is to say, it is possible for the state of the output VOUT to transition before the differential signals on the output lines 114 and 116 have both fully transitioned and settled.

Figures 2A, 2B, 2C:
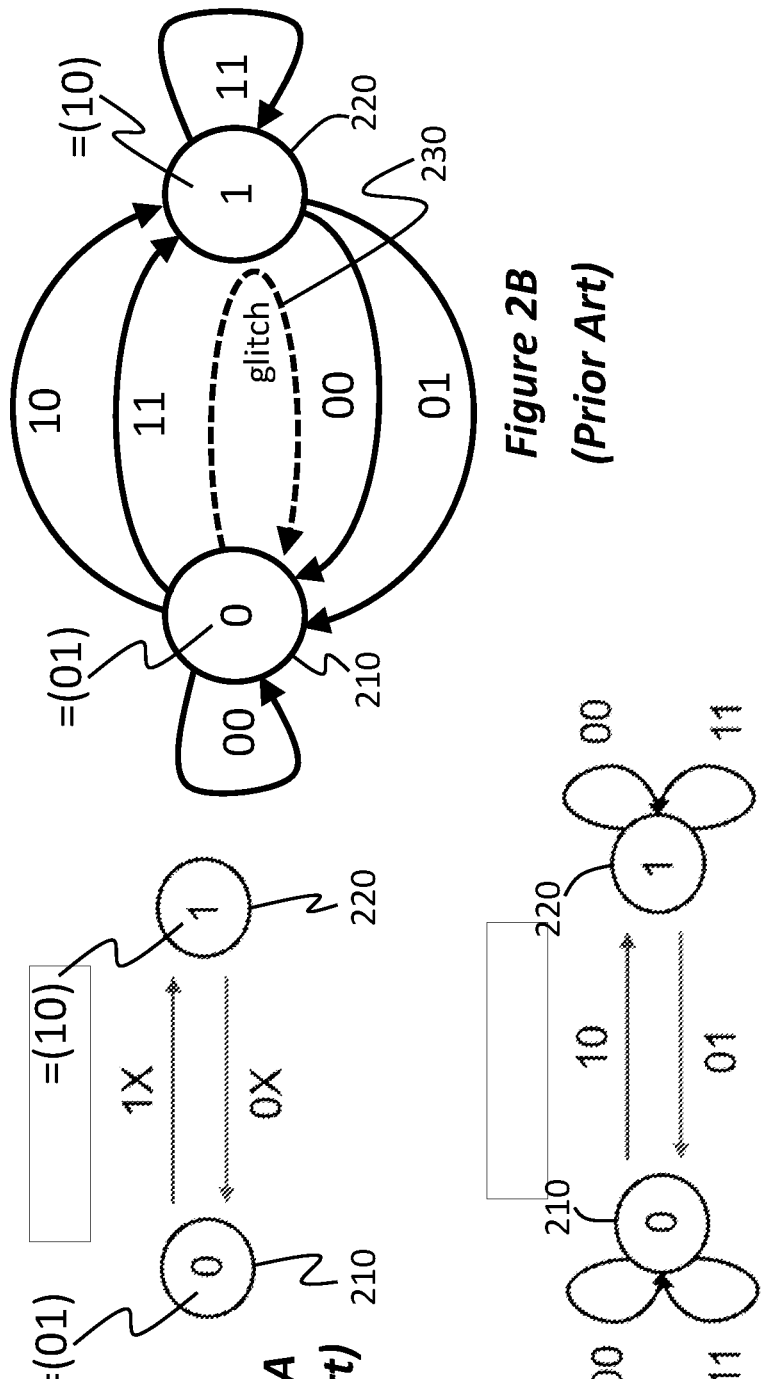
FIGS. 2A and 2B show state diagrams of a conventional level shifter.
FIG. 2C show a state diagram of a level shifter according to one or more embodiments.

FIG. 2 shows a state diagram, at FIG. 2A and FIG. 2B of a conventional level shifter such as that shown in FIG. 1, and at FIG. 2C of a level shifter according to one or more embodiments, as will be discussed hereinbelow.

Considering first FIG. 2A, this shows a first state 210 (corresponding to the single ended output being "0" or low) on the left, and the differential signal on lines 114 and 116 being (01). In applications such as controllers for high side switches of DC-DC converters, there may exist fast common-mode slew rates—during which the voltages of both sides of the differential signal move in the same direction. Such a fast common-mode slew rate may for result in, for instance, a temporary situation where the lines are both high (i.e. (11), and so, according to the state diagram shown in FIG. 2A, the single-ended signal switches prematurely, that is to say before both sides of the differential signal have switched or changed state to result in (10). In other words, a status change to (11) could trigger a hazardous output stage change of "0" to "1".

Conversely, starting from the steady state 220 in which the single ended state is high "1", that is to say, the differential signal is (10), a temporary situation could exist where both lines are low (i.e. (00) resulting in premature switching of the single ended signal to "0".

This is shown in more detail in FIG. 2B: this figure shows, separately, all three possible transitions from the first state 210 "0" or (01): that is to say, (00)—no change, and both (10) and (11)—which result in a change of state to the second state 220 "1" or (10). Similarly the possible transitions from the second state 220 "1" or (10): that is to say, (11)—no change, and both (01) and (00)—which result in a change of state to the first state 210.

Of course, the situation may be even worse or more hazardous: consider for example the sequence:

(10)→(00)→(01)→(00)→(01).

The output switches from "1" to "0" at the first intermediate transition to (00), since it is only using one part of the differential signal. Potentially even worse, the situation is not symmetric: consider for a moment the inverse situation (01)→(00)→(10)→(11)→(10).

The output would switch from "0" to "1" only at when the differential signal sees (1x)—in this instance at (10).

The dashed line 230 in FIG. 2B shows how a temporary transition from 01 (stable) to 11 (unwanted) and back to 01 generates a glitch (temporary '1' state) at the output. This glitch can occur in a level shifter when fast common-mode signals on the supply cause both outputs to temporarily become '1'—e.g. loss of complementarity. These common-mode glitches are prevalent in high performance DC-DC converters.

FIG. 2C shows a two-handed safety state machine, according to one or more embodiments of the present disclosure, which avoids the above problematic and potentially hazardous situation. As can be seen from the diagram, the only way to transition from "0" to "1" state and vice versa is with (10) or (01) signals respectively. Glitches on a level shifter generate unwanted (11) or (00) signals, but not (01) or (10) signals: generation of these signals, does not initiate transition of the output. In other words, both signals must transition for the output to change state—the output will only change from a '0' state to a state when the inputs, starting from a (01) value, reach a (10) value. Temporary excursions to (00), or (11), as might be caused by common-mode supply changes on the level shifter, do not change the output state.

FIGS. 3A-3E show various truth tables associated with the present disclosure. In each case, the two inputs X1 and X2 corresponds to the two sides of the differential signal, and the output Y corresponds to the single ended high-voltage level shifter output. FIG. 3A shows a truth table for a conventional level shifter combiner circuit as described above with respect to FIG. 1. In an idealised scenario, it can be guaranteed that the input signals X1 and X2 are truly differential and only the first and third line would be possible. However, the figure shows a more realistic scenario in which the differential signal may have an intermediate status (11). The output is dependent on only one (X1) of the two inputs, resulting in potentially hazardous switching of the output when the differential signal is in an intermediate state.

FIG. 3B and FIG. 3C show two potential switching sequences of each side of the differential signal and the preferred outputs, which only switches once the differential signal has completely switched. As shown, in order to satisfy this requirement, the output may only change state once both elements of the differential signal have changed state, and must be able to ignore intermediate states.

FIG. 3D shows the truth table for a 2-input Muller C-element circuit. A 2-input Muller C-element circuit, also known as a c-gate or a coincident flip-flop, is a circuit having two inputs and one output, in which the output only switches state when both the inputs coincide. Muller C-elements are thus generally not associated with differential signals—since, in a differential signal, the two inputs should not coincide at all. However, the present inventors have appreciated that it is possible to adapt or modify a 2-input Muller C-element by inverting one of the inputs. The truth table for such a Muller C-elements with an inverted input is shown in FIG. 3E. As can be seen, a transition of input to a combined state (00), or (11), does not result in a change of output, which remains in its previous state—Y(n−1). However, the when the input is at a combined state of (01) or (10), the output state is at "0", or "1" respectively, irrespective of whether the system reached that combined state through an intermediate state (11) or (00), or directly from the opposite state—(10) or (01) respectively.

FIG. 4 shows a block diagram of a level shifter 400 according to one or more embodiments. The level shifter implements such a modified Muller C-element circuit, that is to say, a Muller C-element circuit having one input inverted, as the combiner circuit.

Parts of the circuit are similar to the conventional level shifter circuit 100. Thus the low-voltage circuit 420 which converts a binary single-ended signal on a single input line 412 into a differential signal on a pair of signal lines 402 and 404 corresponds to the low-voltage circuit 120 of FIG. 1. Similarly, the translation circuit 430 which receives the differential signal on the two input lines 402 and 404 in the low-voltage domain and provides a second differential signal, being a copy of the first differential signal, in a high-voltage domain on the two output lines 432 and 434, corresponds to the translation circuit 130 of FIG. 1.

However, the circuit shown in FIG. 4 has a different combiner circuit. Instead of a latch, in embodiments of the present disclosure, there is provided a Muller C-element circuit, which is modified to have one input inverted. This is shown, conceptually, in FIG. 4 which depicts a Muller C-element circuit 440, having two inputs 432 and 444. One of the inputs, 444, corresponds to the output of an inverter 442, which inverts the output 434 from the translation circuit.

The output 450 of the modified Muller C element circuit may thereby be protected against glitches, and in particular against those caused by fast common-mode slew rate.

The circuit according to one or more embodiments depicted in FIG. 4 provides a level shifter from a low-voltage domain to a high-voltage domain. The level shifter can shift a binary signal in the low-voltage domain, illustrated, as an example only, in the figure as a binary square wave having, again as an example only, a low-value of 0V and a high-value of 1.5 V to a binary signal in the high-voltage domain. Again this is depicted in FIG. 4 as a corresponding square wave which may have, as shown a low-voltage of, for example, 48 V and a high-voltage of 43V. Of course, the skilled person will be aware that the level shifting may be to different high-voltage domains (such as, for example, 48 V as is commonly used in the automotive industry, or 120V, 220V, 300V etc. for mains applications). The skilled person will also be aware that the relative voltages of the high and low signals, in one, other or both of the low-voltage domain and high-voltage domain, may be other than that shown.

It should be noted that the modified Muller C element circuit of FIG. 4 may be implemented in practice using other components than the single inverter 442 together with a discrete logic block 440. Such an implementation is shown in FIG. 5.

Figure 5:
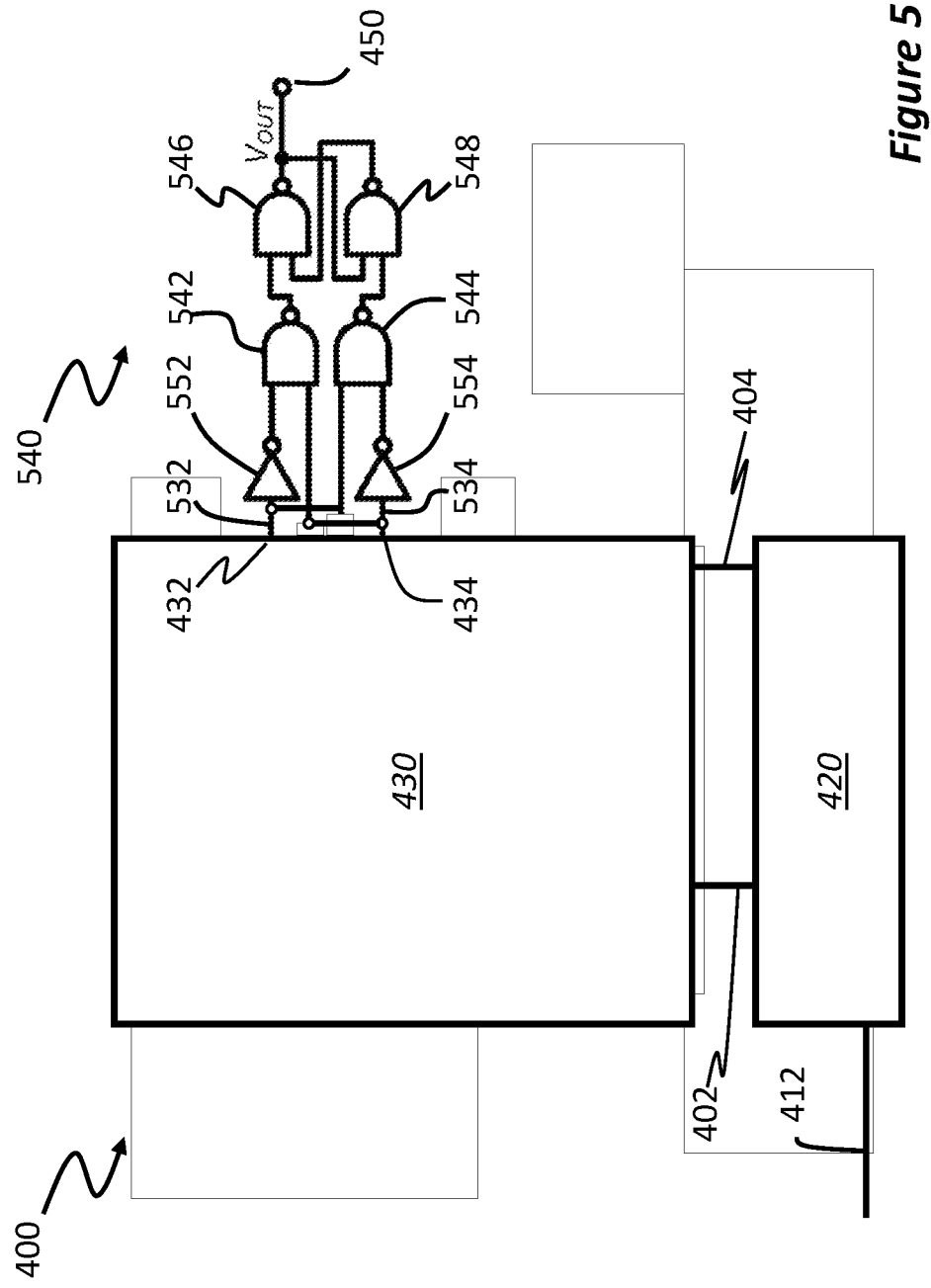
FIG. 5 shows the level shifter of FIG. 4 in more detail.

FIG. 5 shows the level shifter 400 of FIG. 4 in more detail, and in particular as example embodiment in which the modified Muller C-element circuit is implemented using NAND gates and inverters 552, 554. The modified Muller C-element circuit has two inputs 532 and 534. The inputs are connected to the outputs 432 and 434 respectively from the translation circuit 430. Each of the inputs 532 and 534 is connected to two paths, one of which is supplied directly as an input of a respective 2-input NAND gate, 544 and 542 respectively. The other path from each input 532 and 534 is supplied directly to the opposite NAND gate. In other words, the two NAND gates 542 and 544 which form a first pair of NAND gates are each provided with one direct input from, respectively, the translation circuit outputs 434 and 432, and with one inverted input from, respectively, the translation circuit outputs 432 and 434.

The output from each one of the first pair of NAND gates 542 and 544 is connected to a respective input of a one of a second pair of NAND gates, 546 and 548. This second pair of NAND gates are cross-coupled in the sense that the output of each is connected as an input to the other. In other words, each one of the second pair of NAND gates has one input being an output from one of the first pair NAND gates, and a second input being an output of the other of the second pair. An output of one of the second pair of NAND gates, 546, is also provided as the circuit output 450. This output may be referred to as the shifter output VOUT 450.

Figure 6:
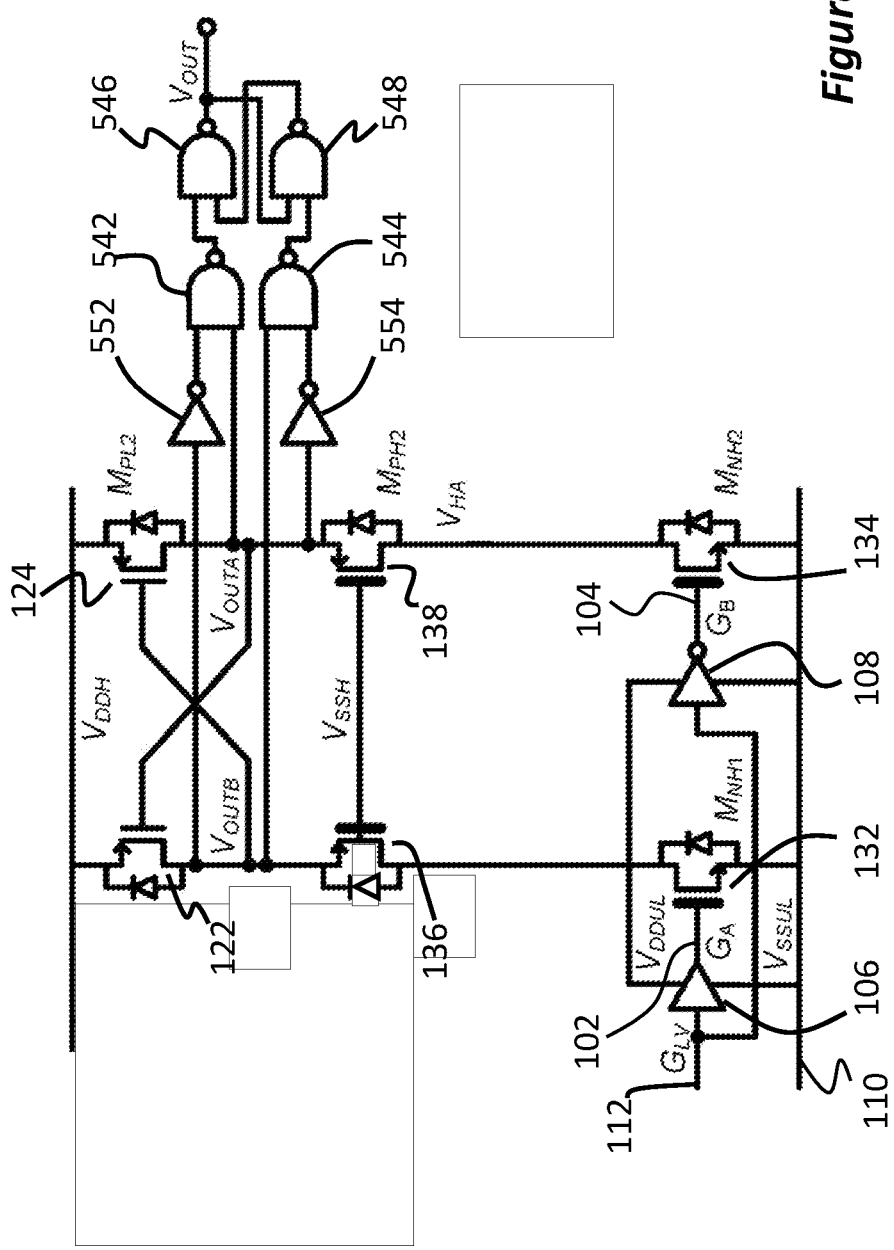
FIG. 6 shows the level shifter of FIG. 4 in yet more detail.

For completeness, FIG. 6 shows the level shifter of FIG. 4 in yet more detail, and in particular, shows the circuit elements which are in common with conventional level shifters such as that shown in FIG. 1. It will be noted that the buffer 106 and inverter 108 are entirely within the low-voltage domain. The pair of transistors MNH1 132 and MNH2 134 have their gates and sources within the low-voltage domain, although they should be "high-voltage" transistors. High-voltage, in the present context, means that they are able to withstand nearly the entire voltage between the high-voltage supply voltage rail at voltage VDDH and ground or VSSUL 110. This is the case in particular when the corresponding transistor or switch 136 and 138 is closed or on. Similarly, the pair of transistors 136 and 138 are also high-voltage transistors since they also have to be able to withstand nearly the entire voltage between the high-voltage supply voltage rail voltage VDDH and ground VSSUL 110, in particular when the corresponding one of switches 132 and 134 is closed or on. Conversely, the cross-coupled transistors 122 and 124, are operable entirely within the high-voltage domain, and thus do not have to withstand a large voltage. They can, therefore, be low-voltage transistors.

It will be appreciated that, since the combiner circuit avoids glitches on the output, it may thereby be possible to avoid the use of additional circuit elements such as filters. Level shifters according to embodiments of the present disclosure may thus be particularly convenient for high-speed level shifters such as may be required in, as a non-limiting example, a high-speed DC-DC converter.

Figure 7:
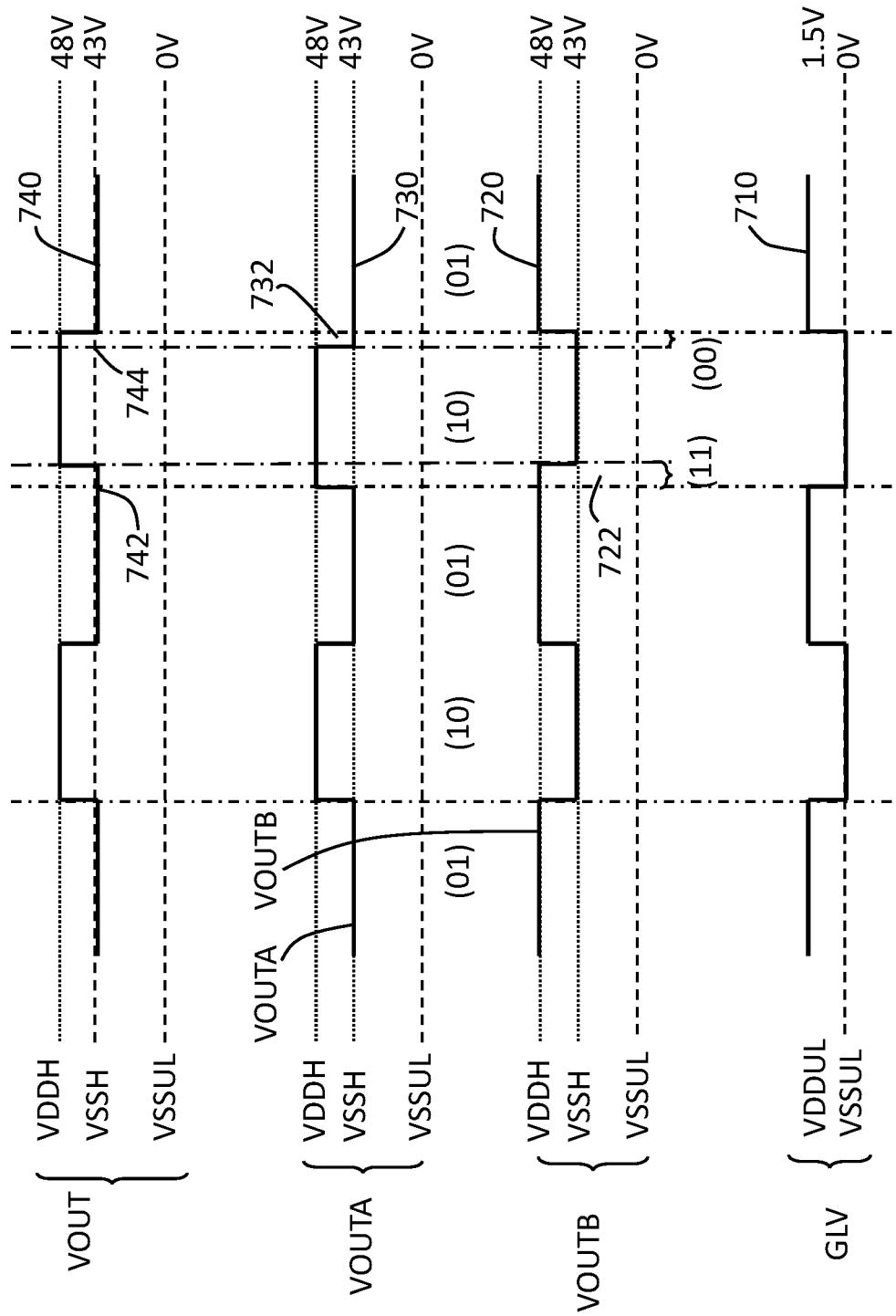
FIG. 7 shows various signals associated with level shifters according to one or more embodiments.

Turning now to FIG. 7, this shows various signals associated with level shifters according to one or more embodiments. Starting at the bottom of the figure, 710 shows the input GLV signal in the low-voltage domain. The low-voltage domain input signal is a binary signal which switches between two levels, (shown as VSSUL and VDDUL). These levels may generally correspond to "high" and "low" logic levels in low-voltage processing and thus may, for example, be 0 V and 1.5 V. Shown in this example is a signal having a 50% duty factor, however, depending on the application, the duty factor may be different or be variable over time. The signal GA at the gate of the first transistor 132 is a copy of the input signal GLV: the signal GB at the gate of the transistor 134 is an inverted copy of the input signal GLV. These two signals, being the low-voltage differential signal, have not been shown, in order to avoid obfuscation.

FIG. 7 also shows the high-voltage differential signal, being the pair of signals VOUTB 720 and VOUTA 730. The signals are generally the inverse of each other, as would be expected for a differential signal, and thus may be represented as shown in the figure as the repeating sequence (01), (10), (01), (10). Each signal switches between two relatively high-voltages VSSH and VDDH, which may be, for example, 43 V and 48 V for an example automotive application. Although the signals are generally the inverse of each other, the figure also shows two "glitches" 722 and 732.

In the glitch 722, a transition from high to low in the signal VOUTB is delayed. Thus, there is a short interval 722 in this glitch in which the differential pair is represented by (11). Also shown is a second glitch 732, in which a transition from high to low on signal VOUTA is early. Thus there is a short interval 732 in this glitch in which the differential pair is represented by (00). Of course, the skilled person will recognise that other glitches, for example in which transitions from low to high on either signal are either delayed or early are equally possible. Furthermore, it will be appreciated that propagation delays between the low-voltage differential signal and high-voltage differential signal have not been shown in this diagram; their effect would merely be to shift signal 730 and 720 to the right with respect to 710.

FIG. 7 further shows the shifter output signal VOUT. In general, the signal follows one side of the differential pair VOUTA and VOUTB—in this case VOUTA. However, as can be seen from the diagram at 742 and 744, the signal does not transition at a glitch in either VOUTA and VOUTB. In particular, it can be seen that the signal does not transition at the moment 742 when the differential signal moves to state (11), rather it waits until VOUTB has also transitioned, such that the differential signal moves to state (10). Similarly, it can be seen that the signal does not transition at the moment 744 when the differential signal moves to state (00); rather it waits until VOUTB has also transitioned such that the differential signal moves to state (01).

As mentioned above, the high-voltage domain may have a supply voltage level VDDH of 48V; the lower level of the high-voltage domain is typically 5V lower than the supply voltage, and thus may be 43V as shown. The supply voltage level may be different (for instance, as discussed above in Maine's applications it may be 120V, 220V, or 240V). Moreover, the supply voltage level may not be fixed but may be variable. In particular, in some automotive applications, the supply voltage level may slew rapidly (thereby providing a common-mode voltage slew for the high-voltage domain). The range of such a variable high-voltage supply may be small, or may be significant—in some applications, it may vary between a voltage as low as 5V or less up to a voltage of 48V or greater. Embodiments of the present disclosure are particularly suited to avoid glitches in the output signal VOUT which may otherwise result from such slewing.

It will be appreciated that propagation delays between the low-voltage differential signal and high-voltage differential signal have not been shown in this diagram; their effect would merely be to shift signals 720, 730 and 740 to the right with respect to 710.

As used herein, "domain" means a voltage level including a range of voltages, typically referenced to a reference voltage level. Thus a low-voltage domain may for instance encompass voltages of 0-5V relative to a ground voltage at 0V, and a high-voltage domain my have voltages 43-48V relative to the same 0V ground voltage. Other levels and ranges may apply, such as, without limitation, 0-10V and 20-30V for a low-voltage domain and a high-voltage domain respectively.

From reading the present disclosure, other variations and modifications will be apparent to the skilled person. Such variations and modifications may involve equivalent and other features which are already known in the art of level shifters, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. A level shifter comprising:
   a translation circuit having two input lines and two output lines and configured to receive a first differential signal in a low-voltage domain on the two input lines and provide a second differential signal, being a copy of the first differential signal, in a high-voltage domain on the two output lines;
   and a combiner circuit configured to convert the second differential signal into a single-ended signal at a high-voltage shifter output;
   wherein the combiner circuit comprises a two-input Muller C-element circuit wherein one input is inverted.

2. The level shifter as claimed in claim 1,
   wherein the output of the Muller C-element circuit is configured to change state only after both elements of the second differential signal have changed.

3. The level shifter as claimed in claim 1,
   wherein the two-input Muller C-element circuit, is implemented using NAND gates and inverters.

4. The level shifter as claimed in claim 1,
   wherein the Muller C-element circuit comprises two stages, each stage comprising a pair of NAND gates,
   wherein the NAND gates of the second stage being cross-coupled such that an output from each NAND gate is connected to an input of the other NAND gate,
   wherein the output from one of the NAND gates is coupled to the high-voltage shifter output.

5. The level shifter as claimed in claim 4,
   wherein a second input of each of the NAND gates of the second stage is coupled to an output of one of the NAND gates of the first stage,
   wherein each NAND gate of the first stage has
      a first input connected to a first one of the output lines of the translation circuit, and
      a second input connected to a second one of the output lines of the translation circuit.

6. The level shifter as claimed in claim 1,
   wherein the two-input Muller C-element circuit, is implemented using NOR gates and invertors.

7. The level shifter as claimed in claim 1,
   wherein the translation circuit comprises a pair of cross-coupled FETs operable in the high-voltage domain,
   each having a source connected to a high-voltage supply line,
   each having a drain connected to a respective one of the two output lines, and
   each having a gate connected to a respective other of the two further lines.

8. The level shifter as claimed in claim 7,
   wherein the translation circuit further comprises a further pair of FETs,
   each having a source connected to a ground,
   each having a gate coupled to respective ones of the two input lines, and
   each having a drain connected to a respective drain of a respective one of a yet further pair of FETs,
   the yet further pair of FETs each having a source connected to a respective one of the two output lines, and each having a gate connected to the gate of the other one of the further pair of FETs.

9. The level shifter as claimed in claim 8,
   wherein the further pair of FETs and the yet further pair of FETs are each operable across the low-voltage domain and the high-voltage domain.

10. The level shift as claimed in claim 1, further comprising
    a low-voltage circuit configured to convert a single-ended signal at a low-voltage shifter input into the first differential signal.

11. The level shifter as claimed in claim 10,
    wherein the low-voltage circuit comprises
       a buffer connecting the low-voltage shifter input to the gate of a one of the pair of FETs, and
       an inverter connecting the gate of the other of the further pair of FETs is to the low-voltage shifter input.

12. A method of level shifting a signal from a low-voltage domain to a high-voltage domain, the method comprising:
    providing the signal in the low-voltage domain as a first differential signal;
    translating the first differential signal from the low-voltage domain into a second differential signal in the high-voltage domain, and
    converting the second differential signal in the high-voltage domain into a single-ended signal using a Muller C-element circuit;
    wherein the Muller C-element circuit has one input inverted.

13. The method of claim 12,
    wherein the signal is a single-ended binary signal
    further comprising converting the single-ended binary signal into the first differential signal within the low-voltage domain.

14. The method of claim 12,
    wherein the Muller C-element circuit comprises a first stage and a second stage, each stage comprising a pair of NAND gates,
    wherein the NAND gates of the second stage being cross-coupled such that an output from each NAND gate is configured to provide an input to the other NAND gate,
    the output from a one of the second stage NAND gates being coupled to an output for the single-ended signal.

15. The method of claim 14,
    wherein an output of each NAND gate of the first stage is configured to provide an input to each NAND gate of the second stage, and
    wherein each NAND gate of the first stage is configured to be coupled to a first signal from the second differential signal and to a second signal from the second differential signal via an inverter.

16. A level shifter comprising:
    a first part configured to receive a first differential signal from a low-voltage domain and translated into a second differential signal level shifted to a high-voltage domain, and
    a second part, configured to receive the second differential signal and provide a level shifted output, wherein the second part comprises a two-input Muller C-element circuit having one input inverted.

17. The level shifter as claimed in claim 16, wherein an output of the Muller C-element circuit is configured to change state only after both elements of the second differential signal have changed.

18. The level shifter as claimed in claim 16, wherein the two-input Muller C-element circuit, is implemented using NAND gates and inverters.

19. The level shifter as claimed in claim 16, wherein the Muller C-element circuit comprises a first stage and a second stage, each stage comprising a pair of NAND gates, wherein the NAND gates of the second stage being cross-coupled such that an output from each NAND gate in the second stage is coupled to an input of the other NAND gate in the second stage, the output from one of the second stage NAND gates coupled to an output and configured to provide the level shifted output.

20. The level shift as claimed in claim 16, wherein the low-voltage domain is configured to convert a single-ended input signal into the first differential signal.

21. The level shift as claimed in claim 16, wherein the Muller C-element circuit is a circuit having two inputs and one output, in which the output only switches state when both the inputs coincide.

* * * * *